(12) United States Patent
Sun et al.

(10) Patent No.: US 8,858,745 B2
(45) Date of Patent: Oct. 14, 2014

(54) CORROSION-RESISTANT BONDING AGENTS FOR BONDING CERAMIC COMPONENTS WHICH ARE EXPOSED TO PLASMAS

(75) Inventors: Jennifer Y. Sun, Mountain View, CA (US); Ren-Guan Duan, Fremont, CA (US); Kenneth S. Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1036 days.

(21) Appl. No.: 12/291,747

(22) Filed: Nov. 12, 2008

(65) Prior Publication Data

US 2010/0119844 A1    May 13, 2010

(51) Int. Cl.

| | |
|---|---|
| C03B 29/00 | (2006.01) |
| C04B 37/00 | (2006.01) |
| C03C 3/247 | (2006.01) |
| C03C 3/32 | (2006.01) |
| C04B 35/119 | (2006.01) |
| C03C 8/24 | (2006.01) |
| B32B 17/06 | (2006.01) |
| C04B 9/02 | (2006.01) |
| H01L 21/67 | (2006.01) |

(52) U.S. Cl.
CPC ........... *C03C 3/247* (2013.01); *C04B 2237/343* (2013.01); *H01L 21/6719* (2013.01); *C04B 37/005* (2013.01); *C04B 2235/5445* (2013.01); *C04B 2235/6567* (2013.01); *C04B 2235/6562* (2013.01); *C03C 3/325* (2013.01); *C04B 35/119* (2013.01); *C04B 2237/10* (2013.01); *C04B 2237/72* (2013.01); *C04B 2237/60* (2013.01); *C04B 2237/064* (2013.01); *C04B 2235/3225* (2013.01); *C04B 2235/3201* (2013.01); *C04B 2237/708* (2013.01); *C04B 2235/445* (2013.01); *C04B 2235/6565* (2013.01); *C04B 2235/80* (2013.01); *C04B 2235/3206* (2013.01); *C04B 2237/34* (2013.01); *C03C 8/24* (2013.01); *C04B 2237/08* (2013.01)

USPC .................. 156/89.11; 428/426; 106/14.05

(58) Field of Classification Search
USPC ........ 156/89.11, 60, 325; 428/426; 106/14.05
See application file for complete search history.

(56) References Cited

U.S. PATENT DOCUMENTS

| | | | | |
|---|---|---|---|---|
| 3,384,508 | A | * | 5/1968 | Bopp et al. .................... 428/332 |
| 3,715,196 | A | * | 2/1973 | Montierth ....................... 65/33.3 |
| 4,434,211 | A | * | 2/1984 | Shoher et al. .................. 428/552 |
| 5,368,673 | A | * | 11/1994 | Okuda et al. ................. 156/273.9 |
| 5,534,091 | A | * | 7/1996 | Okuda et al. ................ 156/89.15 |
| 6,221,197 | B1 | | 4/2001 | Mori et al. .................... 156/308.6 |
| 6,620,282 | B2 | | 9/2003 | Mori et al. .................... 156/272.2 |
| 6,783,875 | B2 | | 8/2004 | Yamada et al. ................ 428/697 |

* cited by examiner

*Primary Examiner* — Philip Tucker
*Assistant Examiner* — Alex Efta
(74) *Attorney, Agent, or Firm* — Shirley L. Church, Esq.

(57) ABSTRACT

Embodiments of the invention relate to component structures which are useful as apparatus in plasma processing chambers. Portions of the component structures are bonded together using oxyfluoride-comprising glazes, glass ceramics, and combinations thereof. The bonding material is resistant to halogen-containing plasmas and exhibits desirable mechanical properties.

6 Claims, 7 Drawing Sheets

CORROSION-RESISTANT BONDING AGENTS FOR BONDING CERAMIC COMPONENTS WHICH ARE EXPOSED TO PLASMAS

FIELD

Embodiments of the invention relate to compositions including oxyfluoride-comprising glazes, glass ceramics, and combinations thereof which are useful as bonding agents between surfaces of plasma-resistant component structures. A substrate to which a bonding agent is applied may be a coated surface where the coating is compatible with the bonding agent. In addition, embodiments of the invention relate to structures bonded with the bonding agent, and to methods of co-firing the bonding agent with portions of a component to produce a bonded component.

BACKGROUND

This section describes background subject matter related to the disclosed embodiments of the present invention. There is no intention, either express or implied, that the background art discussed in this section legally constitutes prior art.

A glaze is a specialized form of glass and therefore can be described as an amorphous solid. A glass ceramic is a specialized form of a ceramics, which is formed first as a glass and then made to partially crystallize through a designed heat treatment which involves controlled cooling. Unlike traditional sintered ceramics, glass ceramics do not have pores between crystal grains. The spacing between grains is filled with the glass. Glass ceramics share many properties with both glass and traditional crystalline ceramics. After adjusting the composition of glass ceramics by processing technique, the final material may exhibit a number of advanced properties that the traditional ceramics do not have.

Glazes and glass ceramics have been used to provide protective coatings. To form the protective coatings, typically a powder of the ceramic is placed into a suspending medium, to which a binder composition is added, this combination of ingredients produces a slurry which is applied over a substrate which is to be coated, and then the slurry is sintered under controlled time, temperature and environmental conditions. During sintering, when the fluid coating material is cooled rapidly, typically a glaze is produced; when the coating material is cooled slowly, a glass-ceramic may be obtained.

Chamber liners for plasma processing apparatus, and component apparatus present within processing chambers are exposed to extremely corrosive conditions. Such processing apparatus are used in the fabrication of electronic devices and micro-electro-mechanical structures (MEMS), for example and not by way of limitation. The apparatus are frequently constructed from ceramics such as aluminum oxide, aluminum nitride, and yttrium oxide, for example and not by way of limitation. The plasma erosion resistance for these materials in a fluorine containing plasma of the kind typically used for etching silicon-containing electronic device structures is better than a number of materials which were used in the processing art even 5 years ago. However, there is constantly an effort to try to improve the erosion resistance of etch processing components, as a means of extending the lifetime of the processing apparatus. Recently, ceramic materials which provide improved corrosion resistance have been used in place of aluminum oxide or aluminum nitride. Solid yttrium oxide component structures have demonstrated considerable advantages when used as semiconductor apparatus components in reactive plasma processing. The yttrium oxide substrate typically comprises at least 99.9% by volume yttrium oxide, has a density of at least 4.92 g/cm$^3$, and a water absorbency of about 0.02% or less. The average crystalline grain size of the yttrium oxide is within a range of about 10 µm to about 25 µm. One advantageous yttrium oxide-comprising embodiment substrate, developed by co-inventors of the present invention, limits impurities to the following concentrations or less: 90 ppm Al; 10 ppm Ca; 5 ppm Cr; 5 ppm Cu; 10 ppm Fe; 5 ppm K; 5 ppm Mg; 5 ppm Na; 5 ppm Ni; 120 ppm Si; and 5 ppm Ti. A yttrium oxide-comprising substrate of this general composition may also include up to about 10% by volume of aluminum oxide.

In a typical reactive plasma etch rate test, where the reactive etchant plasma contains plasma species generated from a plasma source gas of $CF_4$ and $CHF_3$, a solid yttrium oxide substrate resists etch by the plasma better than solid aluminum oxide substrate or solid aluminum nitride substrate.

No matter which ceramic substrate is chosen for use as a plasma processing component part, the ceramic is not easy to machine into complex shapes. In addition, some advanced plasma-resistant ceramics such as yttria show lower mechanical properties in comparison with high strength ceramics such as aluminum oxide (alumina), aluminum nitride, silicon carbide and silicon nitride, for example. As a result, it is desirable to bond one section of a ceramic component to another section, to provide a desired overall shape, and to combine the advantages of a plasma-resistant surface with a high mechanical strength underlying structure.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

FIG. 3A shows a photomicrograph 300 of an aluminum oxide substrate 302 bonded to a yttrium oxide-based substrate 304. The magnification, as shown on the scale at the bottom of FIG. 3A is 1,000 times with a scale bar of 50.0 µm.

FIG. 3B shows a photomicrograph 306 which is an enlargement of the area marked 306 on FIG. 3A. The enlarged region 308 is the aluminum oxide substrate, and the enlarged region 310 is the yttrium oxide-based substrate. The magnification, as shown on the scale at the bottom of FIG. 3B is 2,000 times with a scale bar of 20.0 μm.

FIG. 3C shows a photomicrograph 320 which emphasizes a bonding area 324 between the enlarged region of aluminum oxide substrate 322 and the enlarged region of yttrium oxide-based substrate 326. The magnification, as shown on the scale at the bottom of FIG. 3C is 10,000 times with a scale bar of 5.0 μm.

FIG. 3D shows a photomicrograph 328 which is an enlargement of the area marked 328 on FIG. 3C. The area marked 324 is the area in which the bonding agent is present and the area marked 326 is the yttrium oxide-based substrate. The magnification, as shown on the scale at the bottom of FIG. 3D is 40,000 times with a scale bar of 1.0 μm.

FIG. 3E shows a photomicrograph 330 which is an enlargement of the bonding area for purposes of showing the inter-reaction area between the chemical constituents of the aluminum oxide substrate 332, the bonding agent glass ceramic 338, and the yttrium oxide based substrate 334. At the surface of yttrium oxide-based substrate, particles 334 are converting to a different composition by reaction with the bonding agent 338. The magnification, as shown on the scale at the bottom of FIG. 3E is 10,000 times with a scale bar of 5.0 μm.

DETAILED DESCRIPTION OF EMBODIMENTS

Figure 1:
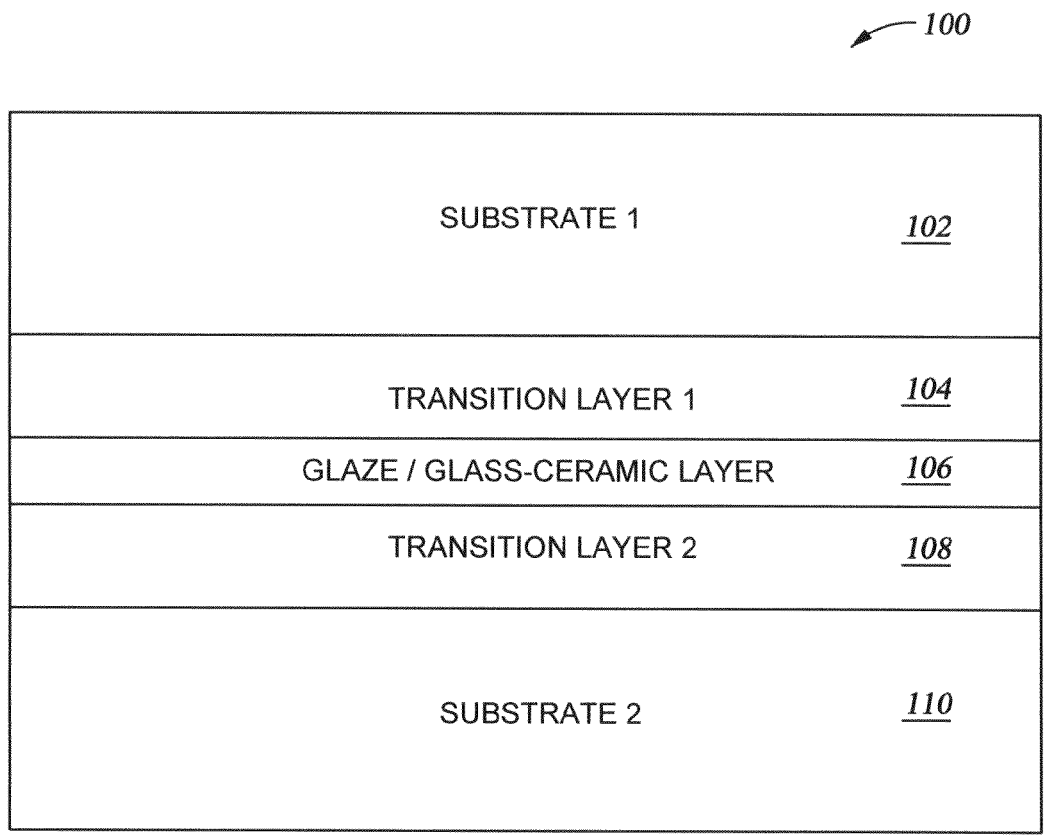
FIG. 1 is a schematic 100 representative of a bonded structure which includes a first substrate 102, bonded to a second substrate 110 using a bonding agent of the kind described in embodiments of the invention. The bonding agent 106 has been sintered between the first substrate 102 and the second substrate 110 in a manner which produces transition layers 104 and 108 adjacent each substrate, with the bonding agent 106 at the center of the structure 100.
Figure 2:
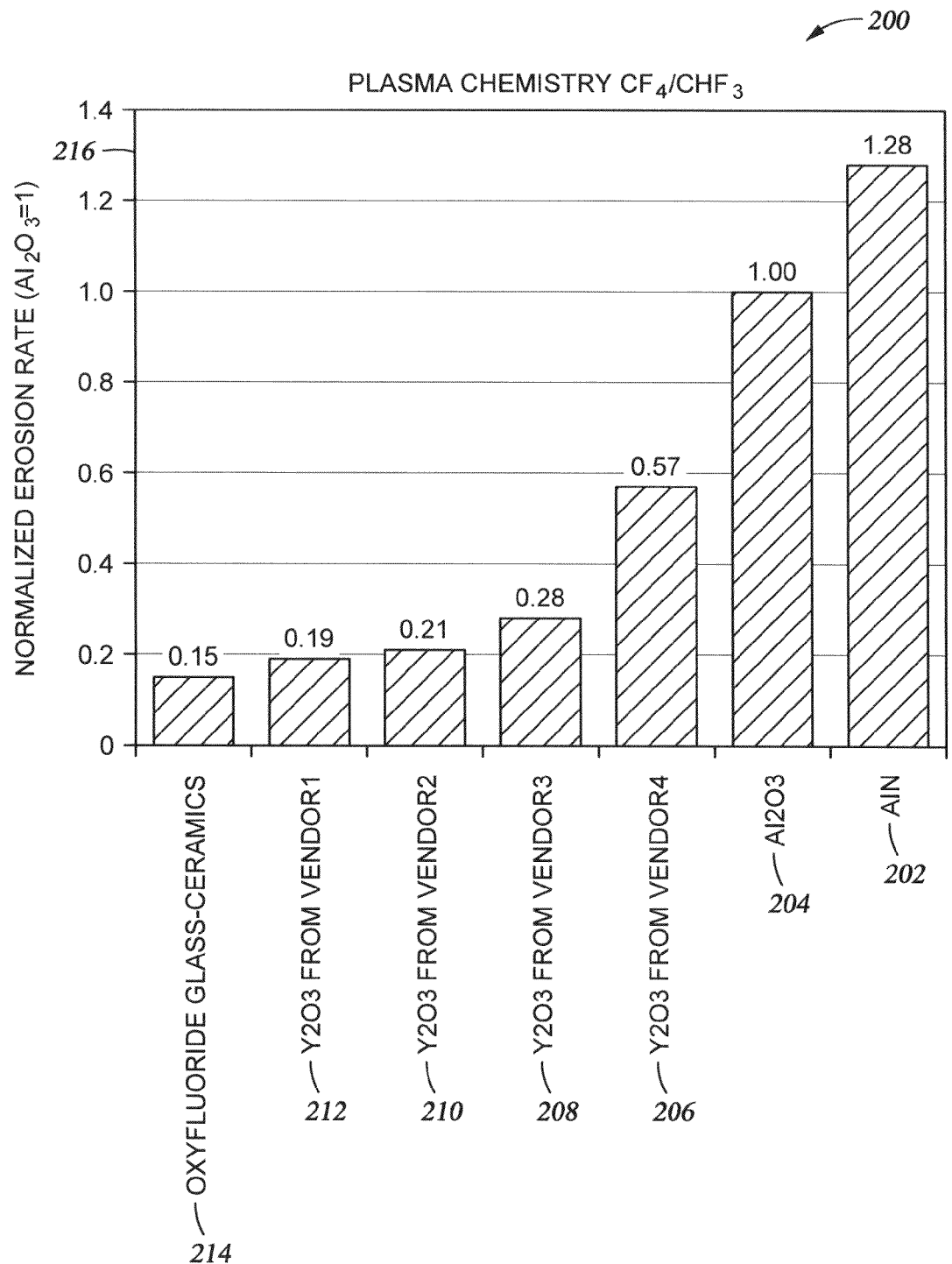
FIG. 2 shows a bar graph 200 which illustrates the relative normalized erosion rates of various solid substrates including aluminum nitride 202, aluminum oxide 204, a series of four yttrium oxides (206, 208, 210, and 212) available from different vendors, and yttrium oxyfluoride glass ceramic 214. The substrates were exposed to a fluorine-comprising plasma created from a source gas comprising $CF_4$ and $CHF_3$.

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

The materials and methods described herein are useful in the design and fabrication of component apparatus parts for semiconductor and MEMS processing equipment. In particular, the materials and methods relate to bonding separate sections of components to produce a component apparatus which is resistant to halogen plasmas in general. In particular, the components described in embodiments herein are resistant to fluorine-containing plasmas which are known to be so problematic in terms of reaction with and erosion of component surfaces. Example component parts of the kind which particularly benefit from the materials and methods described herein include plasma processing chamber apparatus such as a chamber lid interior, shower heads used for gas distribution, process chamber liners, and electrostatic chuck surfaces, by way of example and not by way of limitation. Use of the materials described herein and the method of fabricating parts described herein will provide a significant performance improvement over the known art. For example, the amount of particles formed and metal contamination which is generated during the performance lifetime of the component part will be significantly reduced, and the lifetime of the component part will be extended.

The bonding agents used to bond various ceramic substrates are sintered in direct contact with the substrates to be bonded, so that the bonding is achieved during "co-firing". During the co-firing, the bonding agent in many instances (depending on the substrate) is able to form a transition area between the bonding area and each substrate, to provide improved bonding (improved cohesive strength). In many instances a reaction takes place in the transition area, to produce new compounds which are generated from elements present in the substrate and the bonding agent. The residual bonding agent (bonding layer) which is present after bonding takes place may be in an amorphous form (may be a "glass" or "glaze"), a crystalline form (for example, a ceramic), or may be a glass-ceramic (a combination of amorphous and crystalline materials). The glass-ceramic bonding layer structure (bonding layer) provides a significant advantage in terms of corrosion resistance as well as in mechanical strength of the bond between component parts.

For the embodiments described herein, the bonding agent was applied over the surface of a first substrate by painting dipping, spraying, or screen printing, and then a second substrate was brought into contact with the bonding agent layer. The assembly was supported to maintain the contact of the substrates and bonding layer, and was placed in a furnace for bonding in accordance with one of the sintering profiles described. One of skill in the art will be familiar with various alignment techniques and holding fixtures of the kind which will facilitate contact of the surfaces to be bonded during the sintering process.

A slurry containing the bonding agent in a powdered form, a suspension medium, optionally a binder, and optionally dopants of various kinds, is typically applied over the surface of a substrate using a technique of the kind described above, by way of example and not by way of limitation. The substrates to be bonded must be able to withstand the sintering temperature required to co-fire the bonding agent with the substrates. The slurry containing the bonding agent often comprises at least 10 volume % of a combination of an oxide, typically a metal oxide, and a fluoride, typically a metal fluoride, in a suspending medium. Frequently the volume % of the combination of metal oxide and metal fluoride ranges from 10% to about 50%. The bonding agent is sintered at a sufficient temperature and for a period of time sufficient to permit the formation of transition areas between the bonding agent and the substrates. The performance of the bonding agent in a given application is affected by the composition of the bonding agent and the substrates, as well as the processing conditions used during the bonding process.

The materials which are selected to form the bonding agent depend on the plasma resistance and mechanical properties required for a given component. In the embodiments described below, we have used aluminum oxide ($Al_2O_3$) and yttrium fluoride ($YF_3$) as the bonding agent matrix materials. However, other matrix materials may be used as well. Additives may be incorporated into the matrix. Such additives may also be referred to as dopants.

The bonding agent used to bond together portions of a ceramic component advantageously forms a transition area with respect to each of the ceramic component portions with which it bonds The bonding layer formed upon the co-firing of the bonding agent with portions of the ceramic component is typically a glass-ceramic. The glass-ceramic comprises at least 0.1 volume % glass (amorphous) phase, and typically comprises from 0.1 volume % to about 50 volume % by volume amorphous phase.

Typically, the bonding agent fluoride is a metal fluoride selected from the group consisting of $YF_3$, $NdF_3$, $AlF_3$, $ZrF_4$, $SmF_3$, $CeF_3$, $DyF_3$, $GdF_3$, $InF_3$, $LaF_3$, $ThF_4$, $TmF_4$, $YbF_3$, $BaF_2$, $CaF_2$, and combinations thereof, for example, and not by way of limitation. The oxide is frequently selected from the group consisting of $Al_2O_3$, $Y_2O$, $MgO$, $ZrO_2$, $Nd_2O_3$, $CeO_2$, $Sm_2O_3$, $Er_2O_3$, $Sc_2O_3$, $La_2O_3$, $HfO_2$, $Nb_2O_5$, $SiO_2$, and $Na_2CO_3$, and combinations of these, for example, and not by way of limitation. The additive (dopant) is often selected from rare earth oxides and fluorides, such as $Nd_2O_3$, $NdF_3$, $CeO_2$, $CeF_3$, $Sm_2O_3$, $SmF_3$, $Er_2O_3$, and $ErF_3$. Other oxides and fluorides, such as $AlF_3$, $Sc_2O_3$, $ScF_3$, $La_2O_3$, $LaF_3$, $HfO_2$, $HfF_4$, $Nb_2O_5$, $NbF_5$, $ZrO_2$, $ZrF_4$, $MgO$, $SiO_2$, $Na_2CO_3$, and combinations thereof, not by way of limitation, may also be used. The purpose of the additives is to alter the physical and mechanical properties of a synthesized glaze or glass-ceramic used for bonding applications. -In instances, where there is a metal fluoride present in combination with oxides of the kind described above, the residual bonding agent (bonding layer) will be a glaze (glass) when the cooling rate at the end of the sintering process is rapid, and the bonding layer will be a glass-ceramic when the cooling rate is slow. The fluorides or oxyfluorides, either in a glaze state or in a glass-ceramic state, have demonstrated excellent plasma resistance, particularly to fluoride-containing plasmas. In addition, the bonding strength has been excellent with respect to various ceramic substrates, such as aluminum oxide, aluminum nitride, and yttrium oxide, for example and not by way of limitation.

The starting materials for the bonding agent typically comprise compound powders, a suspension medium, and optionally a binder. A majority % of the compound powders (typically about 50% by weight or greater) is an oxide compound. The remainder of the compound powders are typically a fluoride-comprising material, which is frequently a metal fluoride.

The method of producing a bonded structure includes: selection of the composition of the powders to be used in the bonding agent; selecting of the relative amounts of the various compounds which make up the powder; adjusting the size of the powders to be used, if necessary; selecting a suspension medium; selecting the binder, if a binder is used; adjusting the viscosity of the powder in the suspension medium (this may be done, by way of example, by setting the concentration of powder in the suspension); adjusting the amount of binder, when a binder is used; and, by adjusting the pH of the suspension, if necessary to provide a "fine tuning" of the viscosity. Once the bonding agent suspension is selected to have the desired characteristics, an application method is selected which is compatible with the bonding agent suspension. As previously mentioned, application of the suspension over a substrate surface may be made by painting the suspension over the substrate surface, dipping the substrate in suspension, screen-printing the suspension onto the substrate, spraying the suspension onto the substrate, or spinning the suspension onto the substrate, by way of example and not by way of limitation. The thickness of the bonding agent suspension applied over the substrate which provides an advantageous bonding layer, with transition areas toward a substrate to be bonded, is initially determined experimentally; however, one of skill in the art can determine an advantageous thickness to achieve the desired bonding results with minimal experimentation. Once the bonding agent suspension is in contact with the surfaces to be bonded, at a surface area pressure desired, typically a fixture or "rig" is used to hold the parts which are to become a bonded structure is placed in a sintering chamber. The atmosphere in the sintering chamber may be selected to introduce (or not to introduce) elements into the bonding agent during the bonding process. For example, an air atmosphere may be used to introduce air, while an argon atmosphere may be used to avoid the introduction of additional elements. The most advantageous sintering profile (time at temperatures) is also initially determined experimentally. We have developed some very advantageous sintering profiles for embodiments of the invention which are described below, and these sintering profiles are described in detail herein. Other sintering profiles may be adjusted to compensate for changes in materials, but will have the same general profile shape.

Properties such as thermal conductivity, thermal expansion coefficient, hardness, general mechanical properties, and erosion resistance of the bonded areas of a processing component will be determined in large part by the compounds selected for combination in the bonding agent. If a transition layer is formed by in-situ chemical reaction of a substrate with a metal oxide or fluoride, this may dissipate the stress due to differences in thermal expansion between a substrate and a glaze or glass-ceramic bonding layer. This is a means of providing a stronger bond, and formation of a transition layer is highly recommended.

Exemplary Embodiments

Two types of bonding agents were selected for detailed experimentation. Both of the bonding agents contained at least one metal fluoride. The metal fluorides (including lanthanide fluorides) exhibit relatively low melting points, and this contributes to a low melting temperature even when the bonding agent is a combination of mixed fluoride and oxide powders. Table One below lists the melting points for a number of metal fluorides.

TABLE ONE

| Fluoride | Melting Point ° C. |
| --- | --- |
| $YF_3$ | 1387 |
| $NdF_3$ | 1410 |
| $AlF_3$ | 1260 |
| $ZrF_4$ | 640 |
| $SmF_3$ | 1306 |
| $CeF_3$ | 1250 |
| $DyF_3$ | 1154 |
| $GdF_3$ | 1231 |
| $InF_3$ | 1170 |
| $LaF_3$ | 1493 |
| $ThF_4$ | 1110 |
| $TmF_3$ | 1158 |
| $YbF_3$ | 1157 |
| $BaF_2$ | 1368 |
| $CaF_2$ | 1418 |

EXAMPLE ONE

The first bonding agent developed and evaluated was formed from a combination of $Al_2O_3$ and $YF_3$, with smaller amounts of doping agents. The powder mixture consisted essentially of 94% by weight $Al_2O_3$, 1% by weight $YF_3$, 2% by weight $ZrO_2$, 2% by weight MgO, and 1% by weight $Na_2CO_3$. The $Al_2O_3$ had an average particle size of about 100 nm. The $YF_3$ had an average particle size of about 100 nm. The $ZrO_2$ had an average particle size of about 100 nm. The MgO had an average particle size of about 100 nm. The $Na_2CO_3$ had an average particle size of about 1 μm. A mixture of powders was created by ball milling and was suspended in water to create a slurry, where the concentration of the powder in water ranged from about 15 volume % to about 23 volume % powder. The slurry was then ball milled for at least 2 days.

The slurry was painted onto the surface of the alumina substrate, and after drying, the thickness was about 20 μm. Then the yttrium oxide-based substrate was brought into contact with the painted slurry layer on the surface of the alumina substrate. The assembly was then set into the furnace for heat treatment to accomplish bonding.

Figure 3A:
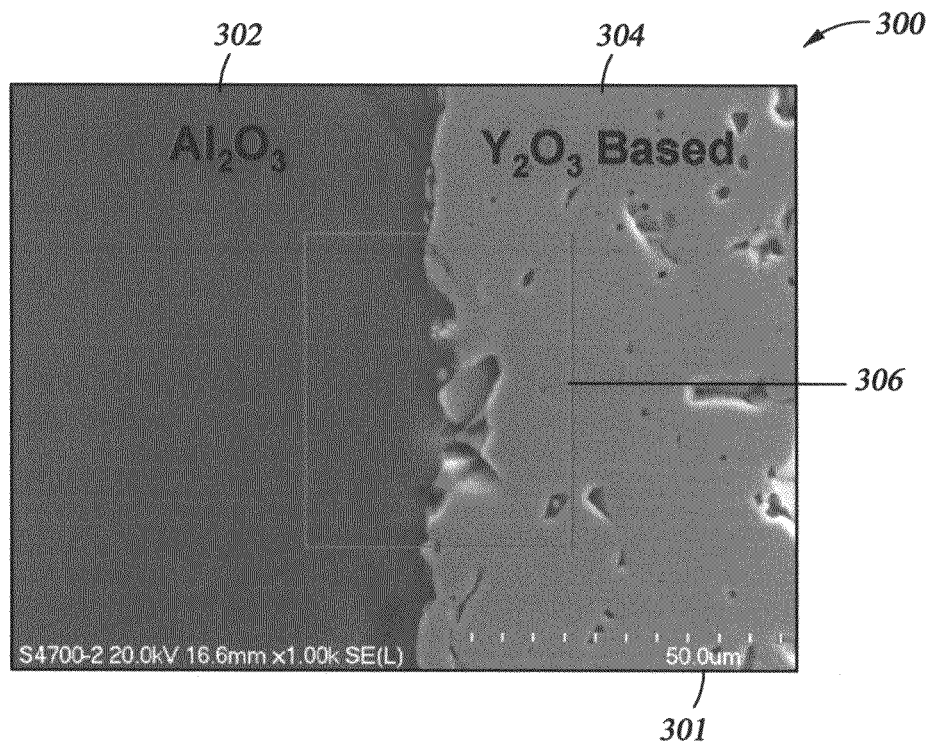
FIGS. 3A through 3E show photomicrographs which illustrate various aspects of an aluminum oxide substrate bonded to a yttrium oxide-based substrate using a bonding agent of the kind described in embodiments of the invention.
Figure 4:
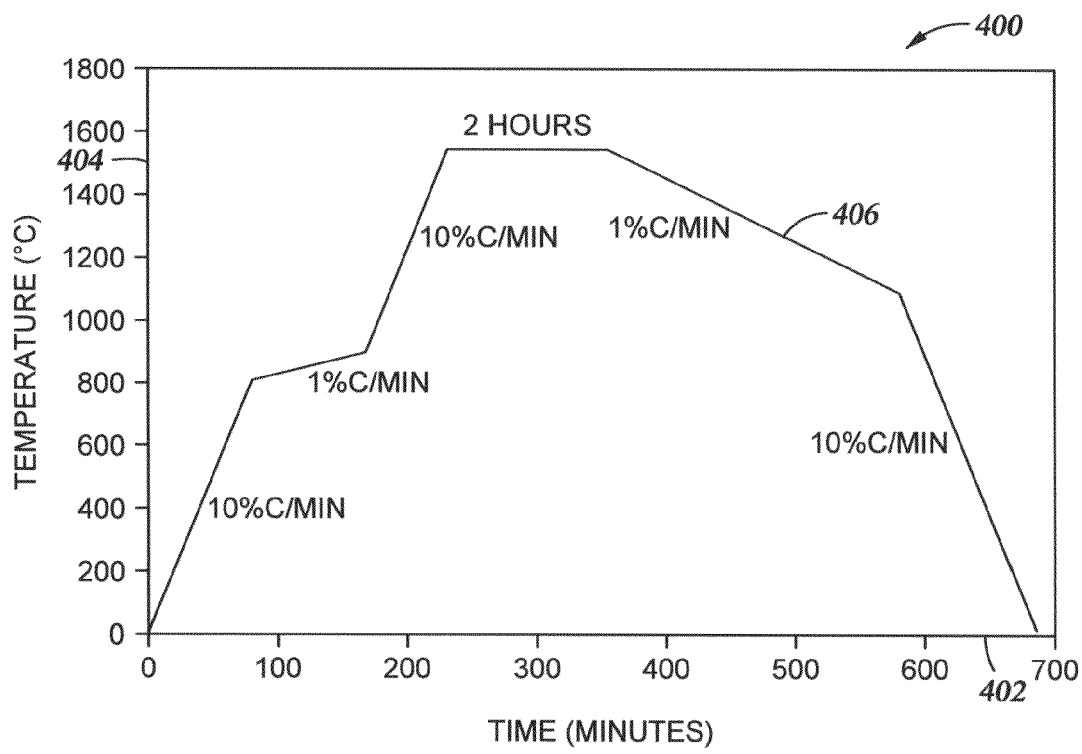
FIG. 4 shows a graph of a sintering process used to bond the aluminum oxide substrate 302 to the yttrium oxide-based substrate 304 as illustrated in FIG. 3A. The time in minutes is shown on axis 402, the temperature in ° C. is shown on axis 404, and curve 406 shows the profile of the bonding process.

The sintering of the structure including an aluminum oxide substrate, bonding agent, and yttrium oxide-based substrate was carried out in an ambient atmosphere of flowing argon. The sintering profile is shown in FIG. 4. The profile graph 400 shows the sintering process used to bond the aluminum oxide substrate 302 to the yttrium oxide-based substrate 304 as illustrated in FIG. 3A. The time in minutes is shown on axis 402, the temperature in ° C. is shown on axis 404, and curve 406 shows the profile of the bonding process. The curve 406 is labeled at various points with the heating rate or cooling rate for linear portions of the curve. The maximum sintering temperature was about 1550° C., for a time period of 2 hours. The initial cool-down rate was 1° C. per minute, for a time period of about 3.5 hours, increasing to a cool-down rate of 10° C. per minute for a time period of about 1.8 hours.

Figure 3B:
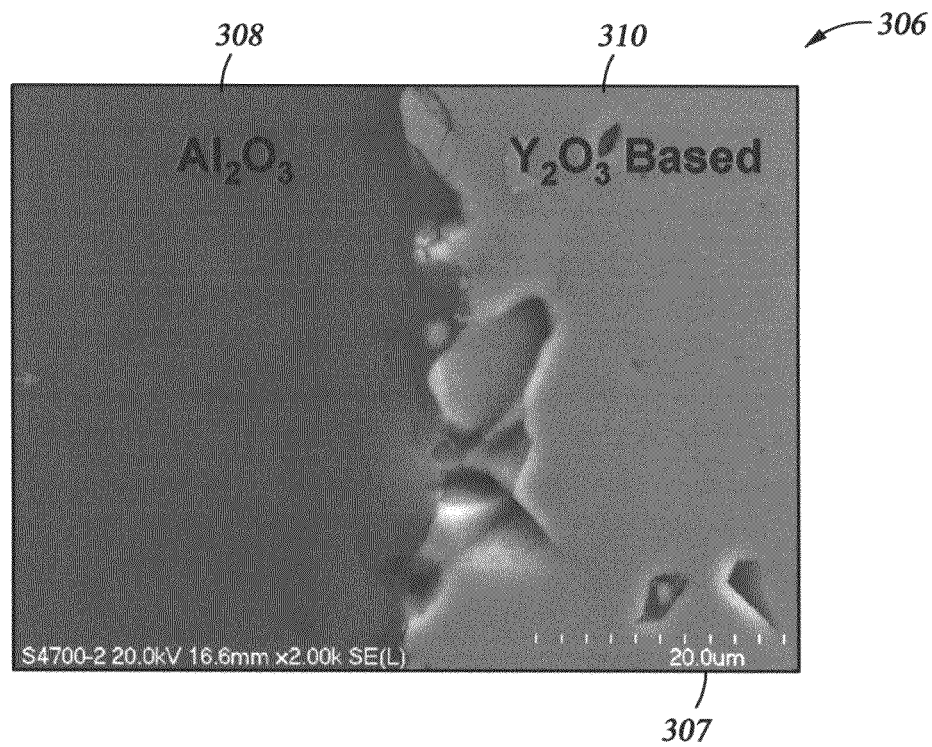
Figure 3C:
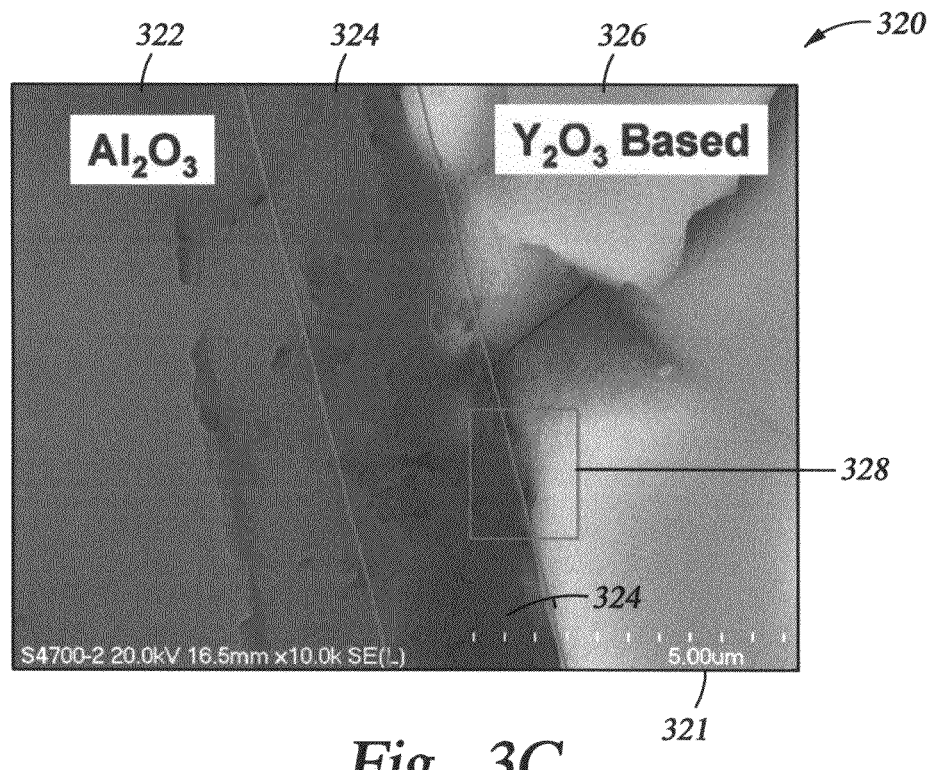
Figure 3D:
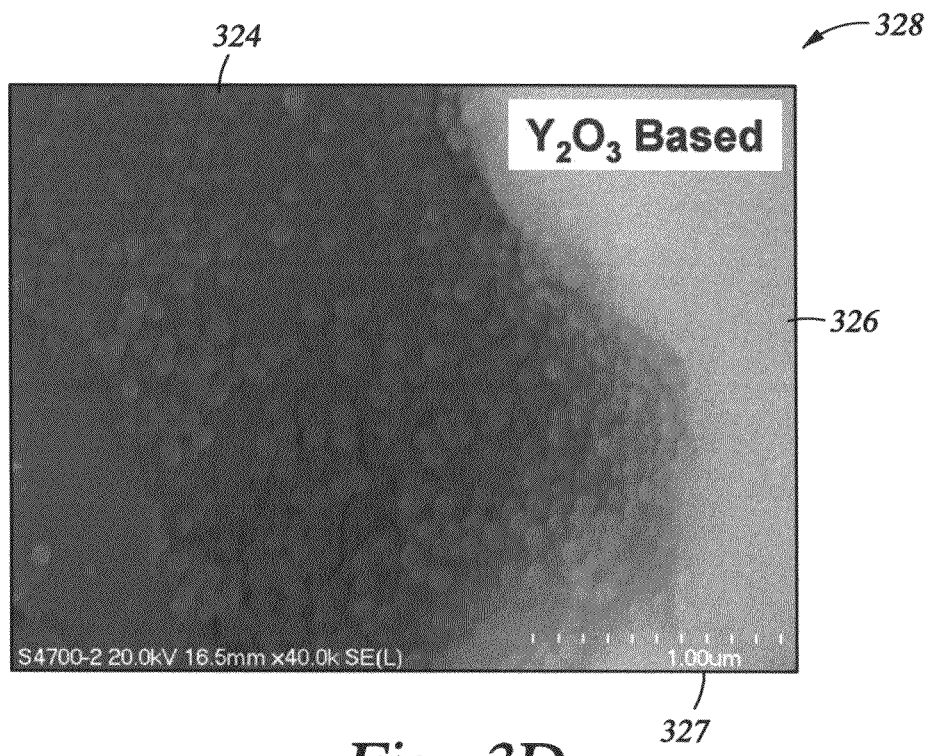
Figure 3E:
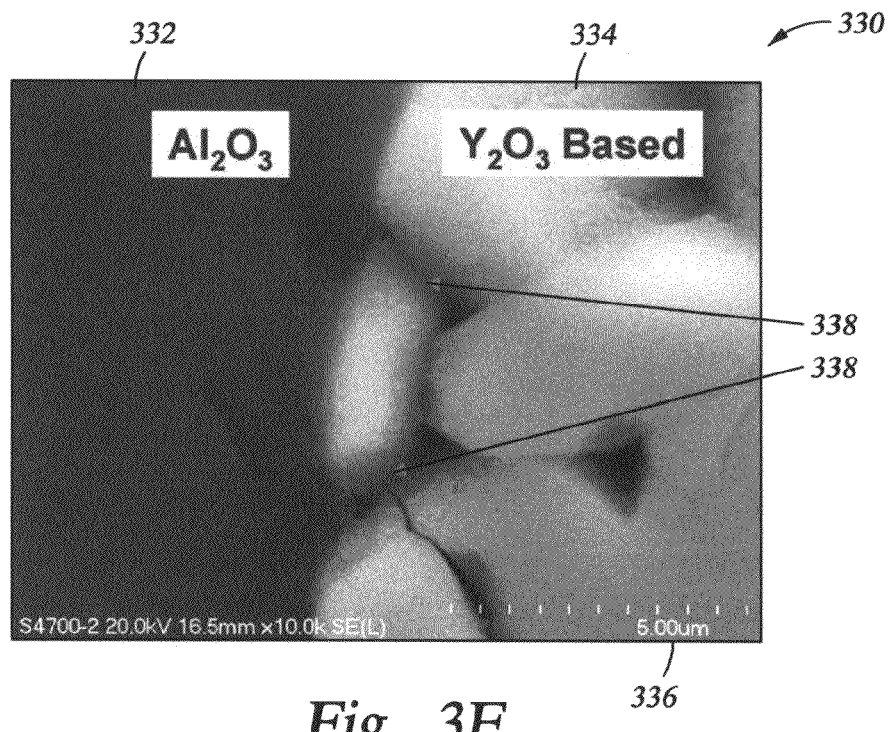

FIGS. 3A through 3E show photomicrographs which illustrate various aspects of an aluminum oxide substrate bonded to a yttrium oxide-based substrate using a bonding agent of the kind described directly above. FIG. 3A shows a photomicrograph 300 of an aluminum oxide substrate 302 bonded to a yttrium oxide-based substrate 304. The magnification, as shown on the scale at the bottom of FIG. 3A is 50.0 μm. It is striking that there is such an intimate contact between all surfaces for the length of the bonding line. FIG. 3B shows a photomicrograph 306 which is an enlargement of the area marked 306 on FIG. 3A. The enlarged region 306 shows the aluminum oxide substrate 308, and the yttrium oxide substrate 310. The magnification, as indicated by the scale at the bottom of FIG. 3B is 20.0 μm. Still, there is the appearance of intimate contact between all surfaces for the length of the bonding line. FIG. 3C shows a photomicrograph 320 which emphasizes a bonding area 324 between the region of aluminum oxide substrate 322 and the region of yttrium oxide-based substrate 326. The magnification, as shown on the scale at the bottom of FIG. 3C is 5.0 μm. Although the photomicrograph shows that there are different colorations at various locations, it is the photomicrograph 328 in FIG. 3D (an enlargement of area 328 in FIG. 3C), which shows how the bonding layer is migrating toward each substrate to integrate with the substrate surfaces. The area marked 324 is the area in which the bonding agent is present and the area marked 326 is the yttrium oxide substrate. Analysis of the bonding layer indicated as area 324 has shown this material to be glass-ceramic, where nano-sized crystals are distributed in a glass matrix. The crystal size is about 100 nm. The magnification indicated by the scale at the bottom of FIG. 3D is 1.0 μm. FIG. 3E shows a photomicrograph 330 which is an enlargement of the bonding area showing the inter-reaction between the chemical constituents of the aluminum oxide substrate 332, the bonding agent glass ceramic 338, and the yttrium oxide based substrate 334. The yttrium oxide-based substrate particles 334 are converting to a different composition in the area or 338 the bonding agent 338 around the edges of particles of 334. The magnification, as shown on the scale at the bottom of FIG. 3E is 10,000 times with a scale bar of 5.0 μm. Whether the inter-reaction illustrates a diffusion of compounds or is representative of a reaction to form new combinations of compounds, either leads to strong bonding which will exhibit good mechanical properties and which will provide a surface which is resistant to penetration by reactive plasmas.

The bonding agent described above, in Example One, when the sintering temperature is higher than the melting temperature of Al—Zr—Mg—Na—O—F (1600° C.), reacts with an $Al_2O_3$-based substrate to form Al—Zr—Mg—Na—O—F melt and reacts with a $Y_2O_3$-based substrate to form Y—Al—Zr—Mg—Na—O—F melt. During cooling, some crystals nucleate and grow to form a glass-ceramic matrix. The glass-ceramic matrix is composed of β-type $Al_2O_3$, m-$ZrO_2$, spinel ($MgAl_2O_4$), and a glass phase. X-ray diffraction patterns suggest the glass phase content is about 20%. The transition layer in contact with the $Al_2O_3$ substrate includes some of the following compounds: β-type $Al_2O_3$, spinel ($MgAl_2O_4$), and m-$ZrO_2$, depending on the starting powder composition and the sintering temperature profile. The transition layer in contact with the $Y_2O_3$ based substrate includes some of the following compounds: $Y_3Al_5O_{12}$, $YAlO_3$, and $Y_4Al_2O9$, depending on the starting powder composition and sintering temperature.

EXAMPLE TWO

The second bonding agent was formed from a combination of $YF_3$—$NdF_3$ glaze and glass ceramic. A series of such bonding agents were prepared, where the powder mixture varied from about 90% by weight $YF_3$ and 10% by weight $NdF_3$ to about 70% by weight $YF_3$ and 30% by weight NdF3. The starting $YF_3$ powder had an average particle size of about 100 nm. The starting $NdF_3$ powder had an average particle size of about 100 nm. A mixture of powders was created and was suspended in ethanol to create a slurry, where the concentration of the powder in ethanol ranged from about 10 volume % to about 50 volume % powder. The slurry was then ball milled for at least 2 days.

Different sintering temperatures led to different phase compositions. Different ratios of $YF_3$ to $NdF_3$ also led to different phase compositions. To save time while evaluating the effect of sintering time and temperature, we prepared a series of samples where the bonding agent was applied over an aluminum oxide substrate and was sintered under different conditions. The sintering was carried out in flowed argon at atmospheric pressure. The bonding agent described in this example was formed by combining a $YF_3$ powder having a starting average powder size of about 100 nm, combined with an $NdF_3$ powder having a starting average particle size of about 100 nm. Powders having a particle size within the range of about 30 nm up to about 1 μm may be used. The concentration of the powder in ethanol ranged from about 10 volume % to about 50 volume % powder. The slurry was then ball milled for at least 2 days. While the suspension in this instance was in ethanol, as an alternative, the suspension media may be water where a binder is used. A binder such as PVA works well. In the present instance, a bonding layer having a thickness of about 20 μm was deposited on the surface of an aluminum oxide substrate by painting slurry onto the alumina substrate.

Figure 6:
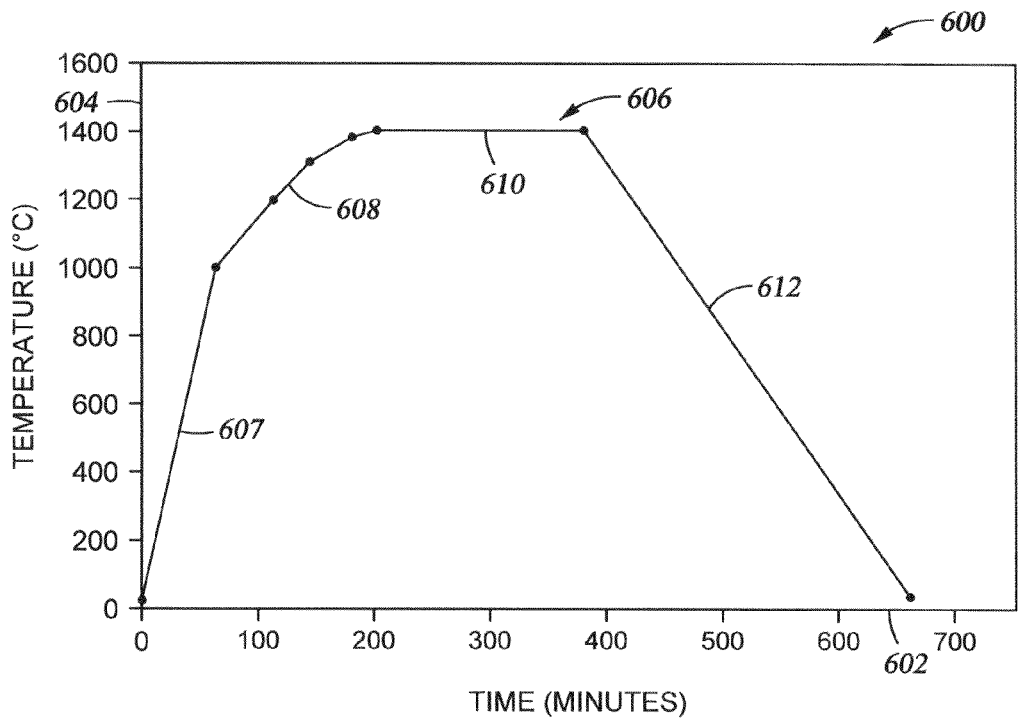
FIG. 6 shows a graph of a sintering process at a maximum temperature of 1410° C. for a time period of 3 hours which was used to prepare the sample specimens shown in FIGS. 5A and 5B. The time in minutes is shown on axis 602 and the temperature in ° C. is shown on axis 604, with curve 606 showing the profile of the bonding process.

A sintering profile applied to the above-described first bonding agent is shown in FIG. 6. The profile graph 600 shows the sintering profile with time in minutes shown on axis 602, the temperature in ° C. is shown on axis 604, and curve 606 shows the profile of the sintering process. The maximum sintering temperature for this profile was about 1410° C., for a time period of 3 hours. The cool-down rate was 5.3° C. per minute, for a time period of about 4.3 hours.

For an 80% $YF_3$-20% $NdF_3$, mixture of powders sintered at 1410° C. for 3 hours, five phases were found in the x-ray diffraction analysis of the sintered bonding layer. These were $Nd_6O_{11}$, $NdAlO_3$, $Nd_4Al_2O_9$, YOF, and $Al_2O_3$, where the YOF and $Nd_6O_{11}$ were from the exposed upper surface of the bonding layer, $NdAlO_3$ and $Nd_4Al_2O_9$ were from a transition layer, with the $Al_2O_3$-containing portion of the bonding layer being in contact with the aluminum oxide substrate. The phase composition and grain size analyzed by XRD for the 80% $YF_3$-20% $NdF_3$ glass-ceramic bonding layer sintered at 1410° C. for 3 hours is presented below in Table Two.

TABLE TWO

| Composition | Phase Composition (%) | Grain Size (nm) |
|---|---|---|
| Amorphous Y—Nd—Al—O—F | 20.26 | — |
| YOF | 23.92 | 5.9 |
| $Nd_4Al_2O_9$ | 16.72 | >100 |
| $Nd_6O_{11}$ | 36.27 | 22.2 |
| $NdAlO_3$ | 1.48 | 16.5 |
| $Al_2O_3$ | 1.35 | 60.9 |

EXAMPLE THREE

Figure 7:
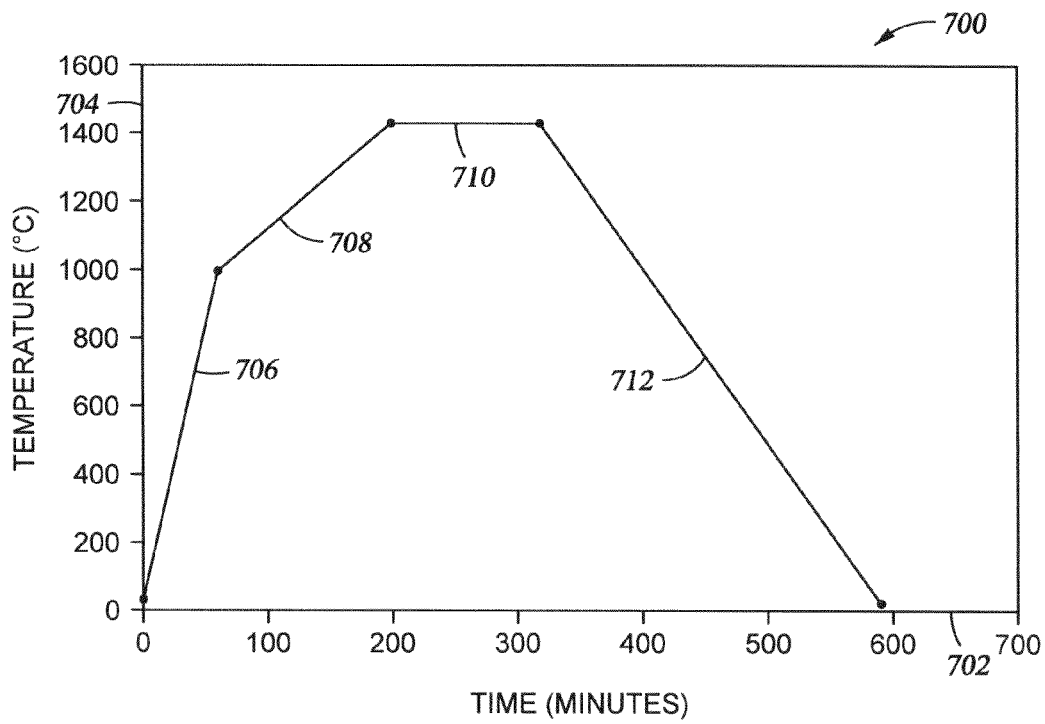
FIG. 7 shows a comparative graph of a sintering process at a maximum temperature of 1430° C. for a time period of 2 hours, where the heat-up rate and the cool-down rate was the same as that in FIG. 6. Applicants describe the difference in the bonded layer formed when the sintering profile used in FIG. 7 is used rather than the sintering profile shown in FIG. 6.

The composition of the starting suspension was the same for Example Two. The thickness of the unsintered bonding agent on the substrate was about 100 μm. The sintering was carried out in air at atmospheric pressure. The sintering time/temperature profile is shown in FIG. 7. The graph 700 shows the time period in minutes on axis 702 and the temperature in ° C. on axis 704. As indicated, the substrate with bonding agent applied was rapidly increased in temperature at a linear rate from room temperature to 1000° C. over a time period of about 60 minutes as illustrated in area 706. The heating rate was then slowed, as indicated by region 708 of the curve, during which the temperature was increased from 1000° C. to 1430° C. over a time period of about 140 minutes. The sintering was then held at a constant temperature of 1430° C. as illustrated in area 610 of the curve for a time period of about 120 minutes. Finally, the substrate was cooled at a linear rate from 1430° C. to room temperature over a time period of about 270 minutes, as indicated by region 712 of the curve. The thickness of the sintered bonding layer produced was about 20 μm.

For an 80% $YF_3$-20% $NdF_3$, mixture of powders sintered at 1430° C. for 2 hours, five phases were found in the x-ray diffraction analysis of the sintered bonding layer. These were $Nd_2O_3$, $Nd_2 \cdot 5Y_2 \cdot 5Al_3O_{12}$, $YAlO_3$, YOF, and $Al_2O_3$, where the YOF and $Nd_2O_3$ were from the exposed upper surface of the bonding layer, $Nd_2 \cdot 5Y_2 \cdot 5Al_3O_{12}$ and $YAlO_3$ were from a transition layer, with $Al_2O_3$ in contact with the aluminum oxide substrate. The phase composition and grain size analyzed by XRD for the 80% $YF_3$-20% $NdF_3$ glass-ceramic bonding layer sintered at 1430° C. for 2 hours is presented below in Table Three.

TABLE THREE

| Composition | Phase Composition (%) | Grain Size (nm) |
|---|---|---|
| Amorphous Y—Nd—Al—O—F | 0 | — |
| YOF | 23.13 | 10.7 |
| $Nd_2O_3$ | 10.78 | >100 |
| $Nd_2 \cdot 5Y_2 \cdot 5Al_3O_{12}$ | 33.05 | >100 |
| $YAlO_3$ | 10.01 | >100 |
| $Al_2O_3$ | 23.03 | 48.1 |

The sintering profile, including heat up rate and cool down rate were the same as for Example Two. However, the sintering temperature increase to 1430° C., and the reduction in dwell time to 2 hours had a very significant and surprising effect on the overall structure of the coating. There is no amorphous phase in the bonding layer, for example. No amorphous phase means that the X-ray diffraction method cannot detect an amorphous phase. However, in fact there is still some amorphous phase present in the sintered structure, where the amorphous phase exists in the grain boundaries.

EXAMPLE FOUR

In this example, the sintering profile is for the same 1430° C., 2 hour sintering time as that in Example Three. However, the starting composition is a 90% $YF_3$-10% $NdF_3$, mixture of powders which was sintered at the 1430° C. for 2 hours. Six phases were found in the x-ray diffraction analysis of the sintered bonding layer. These were $Nd_2O_3$, $Nd_4Al_2O_9$, $Nd_2 \cdot 5Y_2 \cdot 5Al_3O_{12}$, YOF, $AlF_3$, and $Al_2O_3$, where the YOF and $Nd_2O_3$ were from the exposed upper surface of the bonding layer, $Nd_4Al_2O_9$, $Nd_2 \cdot 5Y_2 \cdot 5Al_3O_{12}$, and $AlF_3$ were from a transition layer, with the $Al_2O_3$-comprising portion of the bonding layer being in contact with the aluminum oxide substrate. The phase composition and grain size analyzed by XRD for the 90% $YF_3$-10% $NdF_3$ glass-ceramic bonding layer sintered at 1430° C. for 2 hours is presented below in Table Four.

TABLE FOUR

| Composition | Phase Composition (%) | Grain Size (nm) |
|---|---|---|
| Amorphous Y—Nd—Al—O—F | 4.48 | — |
| YOF | 11.14 | 7.1 |
| $Nd_4Al_2O_9$ | 10.49 | 77.1 |
| $Nd_2O_3$ | 49.58 | 2.4 |
| $Nd_2 \cdot 5Y_2 \cdot 5Al_3O_{12}$ | 14.64 | >100 |
| $AlF_3$ | 4.47 | 47 |
| $Al_2O_3$ | 5.2 | >100 |

When the sintering temperature was higher than the melting temperature of the $YF_3$—$NdF_3$ (1410° C.), Y—Nd—F melt reacted with the substrate $Al_2O_3$ to form Y—Nd—Al—O—F melt. During cooling some crystals nucleate and grow to form glass-ceramics. The glass-ceramic layer comprises YOF and $Nd_2O_3$ (or $Nd_6O_{11}$) and glass phase. X-ray diffraction patterns suggest the glass phase content is about 20%. The transition layer comprises some of the following compounds: $NdAlO_3$, $Nd_4Al_2O_9$, $Nd_2 \cdot 5Y_2 \cdot 5Al_3O_{12}$, $YAlO_3$, and $AlF_3$ depending on the starting powder composition and sintering temperature. The formation mechanisms of the Nd—Al—O, Y—Al—O, and Nd—Y—Al—O phases in the transition layer were as follows. At 1410° C.-1430° C., which is higher than the melting temperature of $YF_3$—$NdF_3$, melt was formed. However, the melt composition is not homogeneous and in the area close to the substrate there is additional Al content. During cooling, the nucleation of Nd—Al—O, Y—Al—O, and Nd—Y—Al—O (heterogeneous) started in the location of the boundary between $Al_2O_3$ substrate and the melt, and then growth continued to obtain such crystal grains.

Figure 5A:
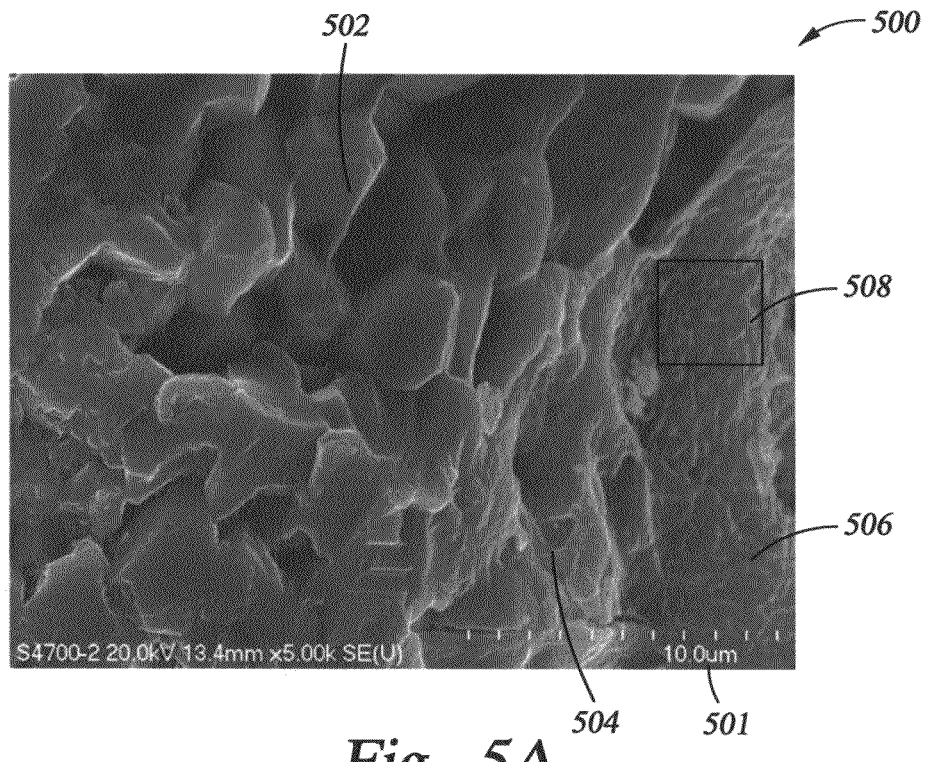
FIG. 5A shows a photomicrograph 500 of the crystalline structure of an aluminum oxide substrate 502 directly adjacent a transition area 504, which is directly adjacent a yttrium neodymium oxy-fluoride glass ceramic 506.
Figure 5B:
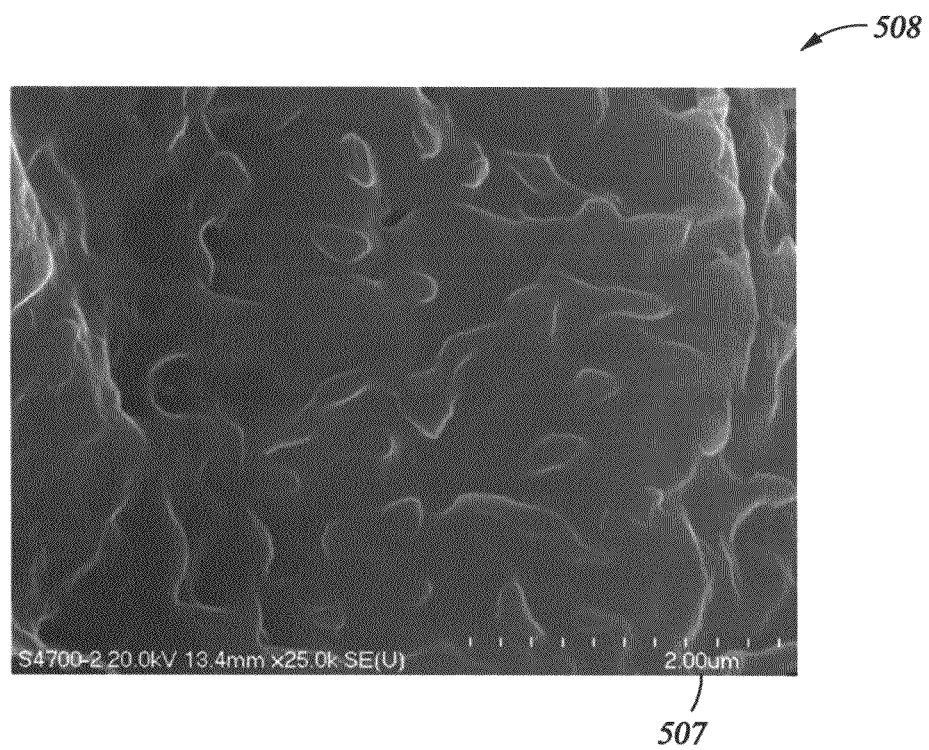
FIG. 5B shows a photomicrograph 508 of the crystalline structure of the yttrium neodymium oxyfluoride glass ceramic 506 at area 508, which is at a magnification which is five times that shown in FIG. 5A.

FIGS. 5A and 5B show photomicrographs which illustrate various aspects of an aluminum oxide bonded to a layer formed from a $YF_3$—$NdF_3$ powder system. The powder used was 70% $YF_3$ and 30% $NdF_3$. FIG. 5A shows a photomicrograph of the structure 500, with the $Al_2O_3$ substrate 502, the transition area 504, and the bonding agent layer 506 having phases of crystalline YOF and $Nd_2O_3$, in combination with amorphous $YF_3$. FIG. 5B shows an enlargement of the bonding agent layer 508 at a magnification is 5× that shown in FIG. 5A. It is clear from the photomicrographs that the smoothness and reduced porosity of the bonding agent layer will make this layer more resistant to a reactive plasma than the substrate to which it is bonded. This means that the bonding agent will not be a source of corrosion/erosion problems with respect to a bonded component.

While the foregoing is directed to embodiments of the present invention, other and further embodiments of the invention may be devised in view of the present disclosure, without departing from the basic scope of the invention, and the scope thereof is determined by the claims which follow.

We claim:

1. A method of bonding together portions of a ceramic component where the component composition is resistant to fluorine-comprising corrosive etchant plasmas used in a semiconductor industry or MEMS industry to produce patterned structures, said method comprising: contacting an area of said portions of a ceramic component to be bonded together with a bonding agent which comprises a metal fluoride selected from the group consisting of $YF_3$, $NdF_3$, $AlF_3$, $ZrF_4$, $SmF_3$, $CeF_3$, $DyF_3$, $GdF_3$, $InF_3$, $LaF_3$, $ThF_4$, $TmF_3$, $YbF_3$, $BaF_2$, $CaF_2$, and combinations thereof, where said bonding agent, when co-fired with said portions of said ceramic component, reacts to form an oxyfluoride glass-ceramic comprising transition area between said portions of said ceramic component and said bonding agent, which transition area includes from at least 0.1 volume % amorphous phase up to about 50 volume % amorphous phase and ,wherein said oxyfluoride glass-ceramic comprising transition area exhibits, upon exposure to a $CF_4$—$CHF_3$ etchant plasma, an erosion rate which is lower than an erosion rate of said portions of ceramic component.

2. A method in accordance with claim 1, wherein said bonding agent comprises said oxyfluoride glass-ceramic comprising transition area in combination with a metal oxide.

3. A method in accordance with claim 2, wherein said metal oxide contains an element selected from the group consisting of Y, Al, Nd, Ce, Sm, Er, Sc, La, Hf, Nb, Zr, Mg, Si, Gd, Tm, Yb, Ba, Na, and combinations thereof, and said glass-ceramic comprising transition area which is formed by said method contains an oxide of at least one of said elements.

4. A method in accordance with claim 1, where said bonding agent diffuses into and reacts with portions of said ceramic component to form a glass-ceramic comprising transition area, where a composition of said glass-ceramic comprising transition area depends on compositions of said bonding agent and said ceramic component.

5. A method in accordance with claim 1, where said bonding agent reacts with two portions of the ceramic component having different chemical compositions to form a glass-ceramic comprising transition area where an overall composition of said glass-ceramic comprising transition area depends on both a composition of said bonding agent and a composition of said two portions of the ceramic component which are being bonded.

6. A method in accordance with claim 4 or claim 5, wherein said bonding agent includes an additive selected from the group consisting of $Nd_2O_3$, $CeO_2$; $Sm_2O_3$, $Er_2O_3$, $ErF_3$, $Sc_2O_3$, $ScF_3$, $La_2O_3$, $LaF_3$, $HfO_2$, $HfF_4$, $Nb_2O_5$, $NbF_5$, $ZrO_2$, $MgO$, $SiO_2$, $Na_2CO_3$, and combinations thereof.

* * * * *